United States Patent
Tseng et al.

(10) Patent No.: US 11,911,904 B2
(45) Date of Patent: Feb. 27, 2024

(54) APPARATUS AND METHODS FOR ENHANCED MICROELECTRONIC DEVICE HANDLING

(71) Applicant: Micron Technology, Inc., Boise, ID (US)

(72) Inventors: Kuan Wei Tseng, Taichung (TW); Brandon P. Wirz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 704 days.

(21) Appl. No.: 16/930,144

(22) Filed: Jul. 15, 2020

(65) Prior Publication Data

US 2022/0016768 A1    Jan. 20, 2022

(51) Int. Cl.
| | |
|---|---|
| *B25J 9/16* | (2006.01) |
| *B25J 19/02* | (2006.01) |
| *H05K 13/08* | (2006.01) |
| *B25J 13/08* | (2006.01) |
| *H01L 23/00* | (2006.01) |
| *H01L 21/67* | (2006.01) |

(52) U.S. Cl.
CPC .......... *B25J 9/1633* (2013.01); *B25J 13/085* (2013.01); *B25J 19/028* (2013.01); *H01L 21/67144* (2013.01); *H01L 24/75* (2013.01); *H05K 13/082* (2018.08); *H01L 2224/7565* (2013.01); *H01L 2224/7592* (2013.01)

(58) Field of Classification Search
CPC ...... B25J 9/1633; B25J 13/085; B25J 19/028; G05B 2219/39528; H05K 13/082; H01L 21/67144; H01L 24/75; H01L 2224/7565; H01L 2224/7592; H01L 21/6838; H01L 2224/75745
See application file for complete search history.

(56) References Cited

U.S. PATENT DOCUMENTS

| | | | |
|---|---|---|---|
| 3,924,456 A | 12/1975 | Vahaviouos | |
| 5,811,910 A | 9/1998 | Cameron et al. | |
| 6,589,809 B1 | 7/2003 | Koopmans | |
| 6,798,120 B1 * | 9/2004 | Fearing ................. | H02N 2/101 310/331 |
| 6,948,387 B2 * | 9/2005 | Chen .................... | G01L 5/0085 73/862.541 |
| 7,101,141 B2 * | 9/2006 | Rezaei ............. | H01L 21/67092 29/426.6 |
| 7,240,711 B2 | 7/2007 | Chan et al. | |
| 7,294,040 B2 * | 11/2007 | Moore .................. | G05B 19/00 451/286 |

(Continued)

FOREIGN PATENT DOCUMENTS

DE    102008040521 A1 *  1/2010  .......... B81B 7/0006

*Primary Examiner* — Octavia Davis Hollington
(74) *Attorney, Agent, or Firm* — TraskBritt

(57) ABSTRACT

An apparatus for handling microelectronic devices comprises a pick arm having a pick surface configured for receiving a microelectronic device thereon, drives for moving the pick arm and reorienting the pick surface in the X, Y and Z planes and about a horizontal rotational axis and a vertical rotational axis, and a sensor device carried by the pick arm and configured to detect at least one of at least one magnitude of force and at least one location of force applied between the pick surface and a structure contacted by the pick surface or a structure and a microelectronic device carried on the pick surface.

31 Claims, 10 Drawing Sheets

(56) References Cited

U.S. PATENT DOCUMENTS

| | | | |
|---|---|---|---|
| 8,919,632 B2* | 12/2014 | Liu | H01L 24/78 |
| | | | 228/103 |
| 8,984,966 B2 | 3/2015 | Beyeler et al. | |
| 9,261,423 B2 | 2/2016 | Benfield et al. | |
| 9,362,481 B2 | 6/2016 | Yu et al. | |
| 9,791,491 B2 | 10/2017 | Ivan et al. | |
| 9,889,521 B2* | 2/2018 | Song | B23K 31/125 |
| 9,902,611 B2 | 2/2018 | Brosh et al. | |
| 2004/0200064 A1 | 10/2004 | Hassan | |
| 2005/0155712 A1* | 7/2005 | Chan | H01L 21/67259 |
| | | | 702/41 |
| 2014/0208850 A1 | 7/2014 | Kim et al. | |
| 2022/0392792 A1* | 12/2022 | Tseng | H01L 21/67271 |

* cited by examiner

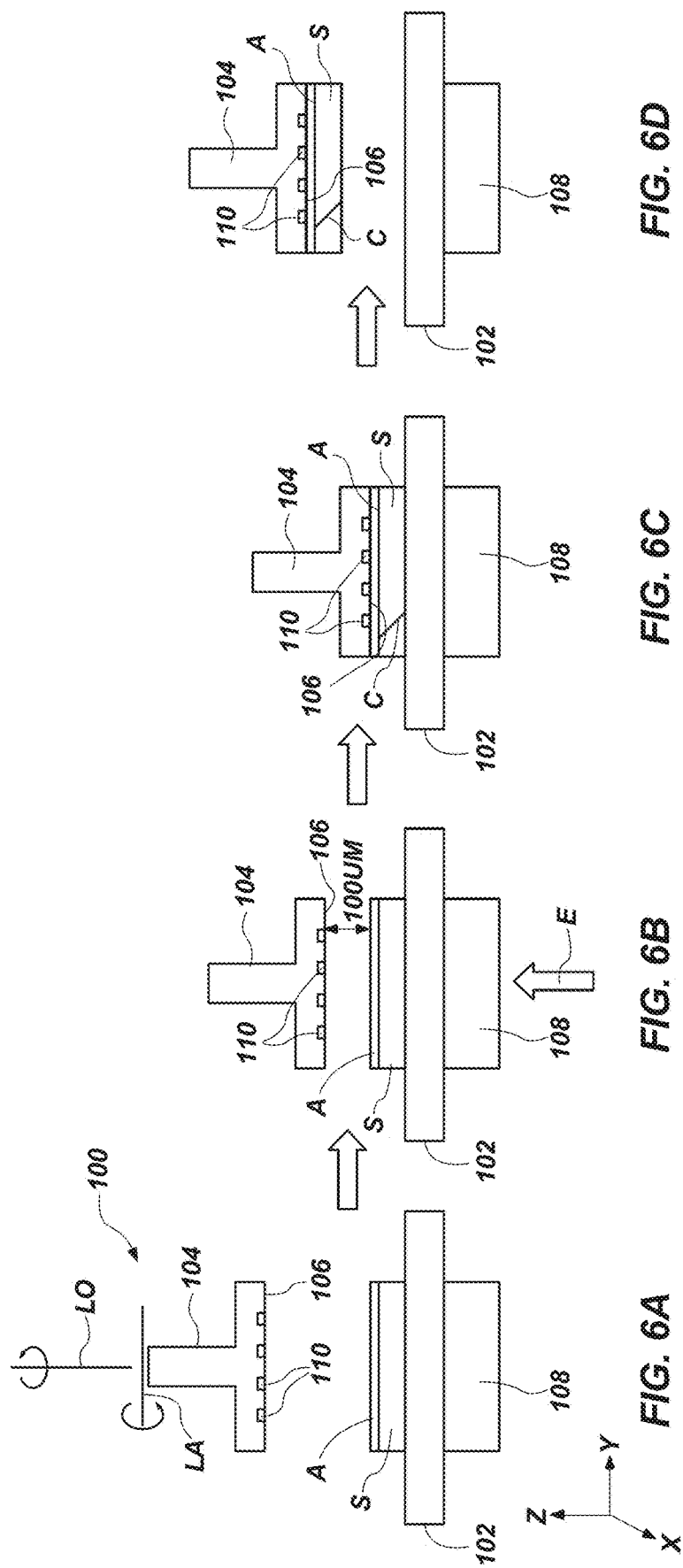

APPARATUS AND METHODS FOR ENHANCED MICROELECTRONIC DEVICE HANDLING

TECHNICAL FIELD

Embodiments disclosed herein relate to apparatus and methods for enhanced handling of microelectronic devices. More particularly, embodiments disclosed herein relate to methods and apparatus for reducing potential for damage to microelectronic devices during physical manipulation of such devices.

BACKGROUND

As performance of electronic devices and systems increases, there is an associated demand for improved performance of microelectronic components of such systems, while maintaining or even shrinking the form factor (i.e., length, width and height) of a microelectronic device or assembly. Such demands are often, but not exclusively, associated with mobile devices and high-performance devices. To maintain or reduce the footprint and height of an assembly of components in the form of microelectronic devices (e.g., semiconductor die), three-dimensional (3D) assemblies of stacked components equipped with so-called through silicon vias (TSVs) for vertical electrical (i.e., signal, power, ground/bias) communication between components of the stack have become more common, in combination with the reduction in component thickness, as well as employment of preformed dielectric films in the bond lines (i.e., spaces between stacked components) to reduce bond line thickness while increasing bond line uniformity. Such dielectric films include, for example, so-called non-conductive films (NCFs), and wafer level underfills (WLUFs), such terms often being used interchangeably. While effective in reducing height of 3D microelectronic device assemblies, the reduction in thickness of microelectronic devices, for example semiconductor dice, to about 50 µm or less increases device fragility and susceptibility to cracking under stress, particularly compressive (i.e., impact) stress and bending stress experienced during handling, for example during a pick and place operation. Decreasing bond line thickness may also exacerbate susceptibility to damage to such extremely thin microelectronic devices, as the thin dielectric material (e.g., NCF) in the bond lines may no longer provide any cushioning effect or ability to accommodate particulate contaminants in the bond lines when, for example, a device is stacked on another device to form a 3D assembly. Non-limiting examples of microelectronic device assemblies including stacked microelectronic devices which may suffer from stress-induced cracking include assemblies of semiconductor memory dice, alone or in combination with other die functionality (e.g., logic) include so-called high bandwidth memory (HBMx), hybrid memory cubes (HBMs), and chip to wafer (C2 W) assemblies.

Accordingly, the inventors herein have recognized that enhanced apparatus and methods are desirable for handling of microelectronic devices, including without limitation conducting a pick-and-place operation including removing a microelectronic device from a source and transferring the microelectronic device for placement in an assembly.

BRIEF DESCRIPTION OF THE DRAWINGS

FIGS. 6A through 6D schematically depict an example pick operation of removing a semiconductor die from dicing tape using a pick arm and an ejector of a pick and place apparatus;

DETAILED DESCRIPTION

Figure 1:
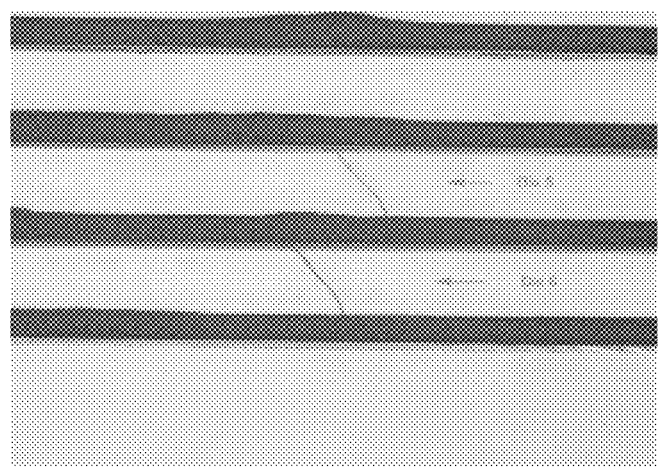
FIG. 1 of the drawings is a photomicrograph showing multiple stacked semiconductor dice with cracks.

Embodiments of the disclosure relate to methods and apparatus for enhanced handling of microelectronic devices by reduction of magnitude and inconsistent application of stresses applied to such microelectronic devices during handling, for example during a pick and place operation involving removal of a microelectronic device from a group of such devices by a pick arm, and transfer of the removed device to a bond tip of a bond head for placement on a substrate or stacking with other devices.

The following description provides specific details, such as sizes, shapes, material compositions, locations and orientations in order to provide a thorough description of embodiments of the disclosure. However, a person of ordinary skill in the art will understand and appreciate that the embodiments of the disclosure may be practiced without necessarily employing these specific details, as embodiments of the disclosure may be practiced in conjunction with conventional process acts and apparatus employed in the industry, suitably modified in accordance with the disclosure. In addition, the description provided below may not form a complete process flow for. Only those process acts and structures necessary to understand the embodiments of the disclosure are described in detail below.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another. In the description and for the sake of convenience, the same or similar reference numerals may be used to identify features and elements common between various drawing figures.

By way of background, microelectronic devices (e.g., semiconductor dice) may experience cracking when a pick arm of a pick and place apparatus contacts a die being picked from a dielectric film (i.e., dicing tape) supported by a film frame as an ejector below the film bearing the die moves the die upward to meet the pick arm. In addition, when the picked die is being transferred by the pick arm to a receiving assembly, for example a bond tip of a bond head used in a thermocompression bonding apparatus, contact on the die due to pick arm movement toward the bond tip may result in cracking. In either instance, impact may result from incorrect over travel of the pick arm toward the die or bond tip, or angular misalignment (i.e., non-coplanarity, non-parallel orientations) of the pick surface of the pick arm with respect to the die surface or bond tip surface so that the two surfaces are non-parallel when the pick arm approaches the die or bond tip. If over travel occurs, the magnitude of the pick surface contacting the die or the die contacting the bond tip surface may initiate cracking. If non-coplanarity occurs, the point contact of an edge of the pick arm with the die surface or of the die surface with the bond tip surface results in orders of magnitude increase of force per unit area on the die, initiating cracking.

To better visualize the problems noted above, FIG. 14 schematically illustrates an example of a pick and place apparatus 100 in combination with an example of a thermocompression bonding apparatus 200 depicting removal of a microelectronic device (e.g., semiconductor die) S from a singulated semiconductor wafer W on dicing tape 102 with an active surface A of the semiconductor die facing upward with conductive elements (not shown) protruding from the active surface A in an NCF. Transfer to a bond tip 204 of a bond head 202 of the thermocompression bonding apparatus 200 is then effected for reorientation and stacking on a substrate (e.g., a target semiconductor wafer including an array of die locations) in a "flip chip" manner with the active surface A of the semiconductor die S facing downward toward the substrate. Pick and place apparatus 100 includes a pick arm 104 which is movable in the X, Y and Z directions and rotatable about a lateral axis LA and about a longitudinal axis LO by linear encoder-equipped drive motors 120X, 120Y, 120Z, and rotary encoder-equipped drive motors 120LA and 120LO under control of a programmed controller 122 including one or more microprocessors 124 in communication with memory 126 storing operational programs and in closed loop communication with optical sensor system 128 for alignment of pick arm 104 with a semiconductor die S to be removed by the pick arm 104 from dicing tape 102 for transfer to bond tip surface 206. Vendors of such apparatus include, without limitation, ASM International of Almere, The Netherlands and Shinkawa, Ltd. of Tokyo, Japan.

Figure 14:
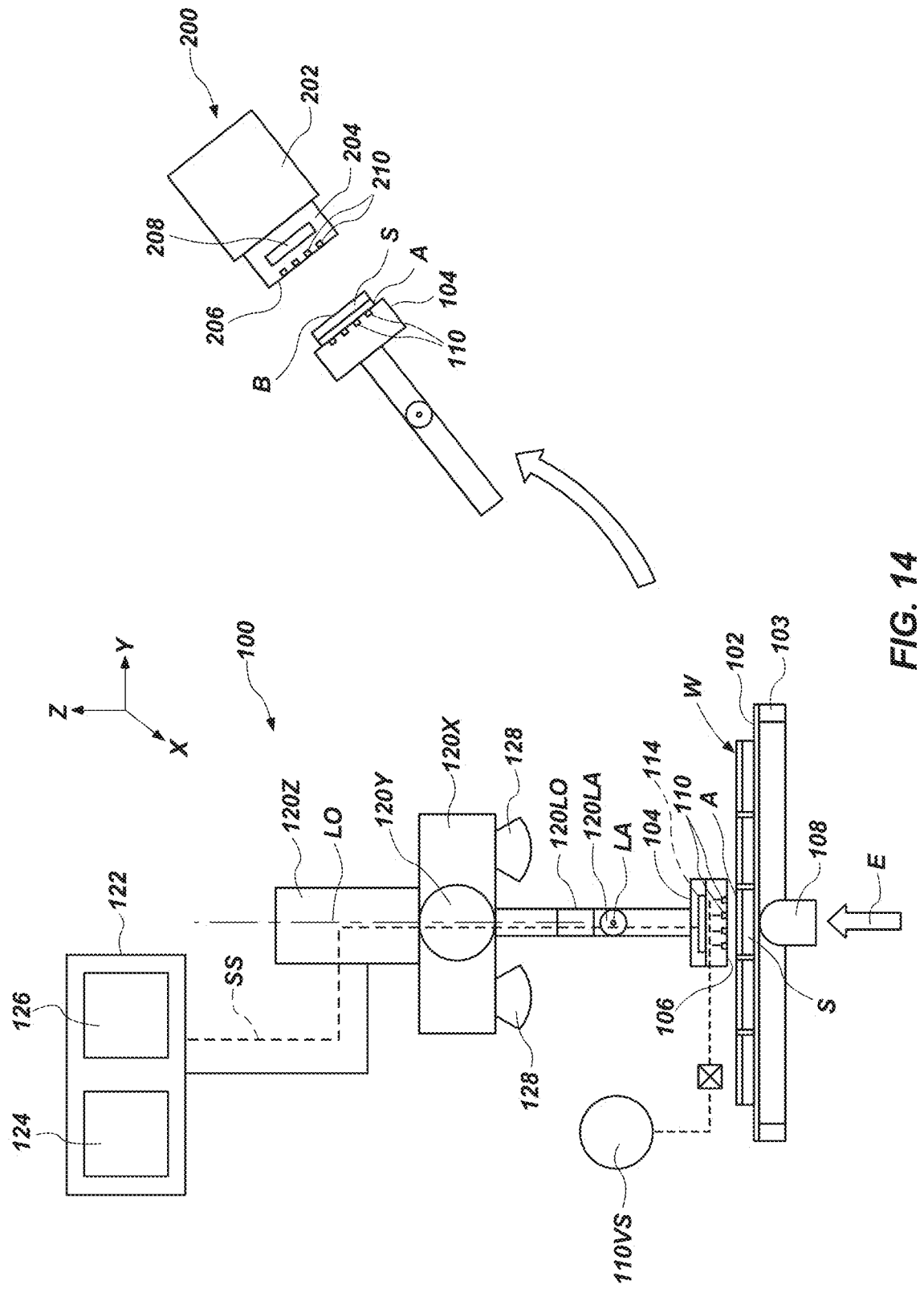
FIG. 14 is a schematic illustration of an example pick and place apparatus in combination with a thermocompression bonding apparatus depicting removal of a microelectronic device from dicing tape and transfer to a bond tip of a bond head for stacking on a substrate.

As shown in FIG. 14, a semiconductor die S singulated from semiconductor wafer W is supported on and adhered to dicing tape 102. As is conventional, the dicing tape 102, which may be a polymer film coated with a UV-release adhesive and peripherally supported by a so-called film frame 103, supports semiconductor wafer W during a so-called "singulation" operation where individual semiconductor die locations on the wafer are separated, as by a diamond-coating dicing saw, after which the dicing tape 102 is stretched to separate the singulated semiconductor dice S for removal from the dicing tape 102. At this point, the semiconductor die S is ready to be picked from the dicing tape 102, and a pick arm 104 of the pick and place apparatus 100 is suspended over and optically aligned with the location of the semiconductor die S using optical sensor system 128. At this point, pick arm 104 has been moved rapidly to a position vertically above and in lateral X, Y plane alignment with semiconductor die S with pick surface 106 parallel to active surface A. Once aligned over semiconductor die S, pick arm 104 is rapidly lowered vertically until a predetermined, preprogrammed standoff distance, for example about 100 µm and up to about 500 µm, is reached between the pick surface 106 of pick arm 104 and active surface A of semiconductor die S, after which travel of the pick arm 104 is slowed significantly to effect a "soft touch" travel to contact NCF over active surface A. Between the time pick arm 104 is slowed and contact is made with active surface A, an ejector 108 moves upward against dicing tape 102 in synchronized upward movement with pick arm 104 as shown by vertical arrow E and presents semiconductor die S to pick surface 106, which is equipped with vacuum ports 110 in selective communication with a vacuum source 110VS and actuated to pull semiconductor die S upward and away from dicing tape 102. Ideally, pick arm 104 and ejector 108 move in unison to minimize (i.e., substantially eliminate) contact force between pick surface 106 and ejector 108 and to simultaneously substantially prevent any gap between the pick arm 104 and the NCF over the active surface A. However, pick arm 104 may over travel and, thus, pick surface 106 may over press semiconductor die S, initiating stress microcracks or even cracks from at least one of impact and excessive force applied. Whether or not over travel occurs, semiconductor die S is then removed for further handling by pick arm 104 and transfer to bond tip surface 206 of bond tip 204 for disposition on a substrate or another semiconductor die S.

Referring again to FIG. 14, an example transfer operation from pick arm 104 to bond tip 204 of a bond head 202 of thermocompression bonding apparatus 200 is illustrated in schematic form. Pick arm 104 carrying semiconductor die S by active surface A has been lifted, moved in the X, Y and Z directions and rotated about lateral axis LA and longitudinal axis LO as required for presentation of back side surface B of semiconductor die S to bond tip surface of bond tip 204 of bond head 202 of thermocompression bonding apparatus 200. As with the pick operation, pick arm 104 is moved rapidly until a preprogrammed standoff distance, for example about 100 μm, between back side surface B and bond tip surface 206 is reached, after which pick arm is moved gently toward, but not in contact with, bond tip 204, which is at an elevated temperature provided by resistance heater 208. The remaining standoff distance substantially isolates semiconductor die S from the heat of the bond tip, which may otherwise cause NCF to become tacky and stick to pick surface 106, or begin to prematurely cure before being stacked on a target substrate or another semiconductor die, compromising bond line integrity. In addition, even when equipment is calibrated properly, variance of coplanarity of the pick surface 106 to the bond tip surface 206 in terms of vertical distance D, as shown and described with respect to FIG. 7B may cause inadvertent contact of the edge of back side surface B of semiconductor die S with bond tip surface 206 without the standoff. When back side surface B is moved into relatively close proximity (e.g., less than about 150 μm to about 200 μm) to bond tip surface 206, vacuum ports 210 therein are actuated and vacuum ports 110 in pick surface 106 are deactivated, to transfer semiconductor die S by its back side B to bond tip surface 206 in a contact-free manner responsive to an air pressure differential. In some instances, the vacuum to vacuum ports 110 in pick surface 106 is reversed to a small positive pressure in a purge sequence and semiconductor die S is "puffed" against bond tip surface 206 for a contactless transfer. In an ideal situation, pick surface 106 has been properly calibrated, when manipulated into proximity to bond head 202, to be co-parallel to bond tip surface 206 at a desired distance so that the transfer of semiconductor die S is, at worst accomplished with any contact force distributed over the back side surface B of semiconductor die S. However, during repeated use the movement of pick arm 104, the bond tip 204, or both, may fall out of calibration, a result of which is that pick surface 106 and, thus back side surface B of semiconductor die S is presented at an acute angle to bond tip surface 206, resulting in edge contact of back side surface B with bond tip surface 206, resulting in edge cracking on back side surface B.

While die microcracking and cracking has always been an issue, it has been exacerbated as noted above by continued reduction in die and bond line thicknesses. Notable instances off die cracking in terms of reduced yield due to handling issues became apparent as die thicknesses reached about 60 μm to about 65 μm, have further increased in number and severity as die thicknesses have reached about 50 and are anticipated to be further exacerbated as die thicknesses of about 30 μm or less are reached in response to industry demands for stacking of ever-more microelectronic devices in a given form factor height.

To further assist the reader's understanding of embodiments of the disclosure, in practice, and using the term NCF for the sake of convenience, a dielectric film in the form of an NCF is adhered over, and to, an active surface of a bulk semiconductor substrate generally in the form of a wafer, for example a silicon wafer upon which integrated circuitry has been fabricated. The wafer, while supported on dicing tape supported on a film frame, is then singulated, for example by a diamond-coated dicing blade, along so-called "streets" between adjacent semiconductor die locations on the wafer to provide individual semiconductor die, each having an NCF on its active surface. Even though the NCF may be laminated to a protective film during transport and handling, once the NCF is laminated to an active surface of the wafer, the protective film is then stripped before singulation of the wafer into individual semiconductor dice occurs, exposing the upper, now-uncovered, exposed surface of the NCF to contamination during singulation as well as during subsequent die handling of neighboring dice, from which residual contaminants on the NCF from singulation may fall.

It has been found that contaminant particles generated by the singulation process and incidentally deposited on the exposed surface of the NCF may cause significant decreases in die yield per wafer. Such particles may be inorganic, for example silicon debris, or organic, such as NCF residue, dicing tape residue or particulates from other sources within a clean room environment. Silicon particles may, for example, cause die cracking when particle size exceeds bond line thickness, while organic particles, if located on conductive elements such as solder-capped conductive pillars or under bump metallization (UBM) for solder bumps, may cause solder non-wetting, compromising electrical communication between stacked die.

Figure 2:
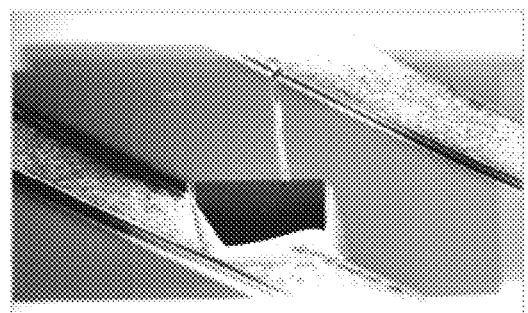
FIG. 2 is an enlarged photomicrograph showing crack invasion by an underfill material in the bond line.
Figure 3:
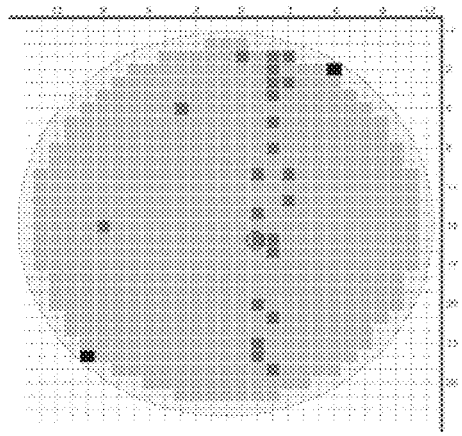
FIG. 3 is a top elevation photograph of a map of a semiconductor wafer indicating cracked semiconductor dice as dark rectangles.
Figure 4:
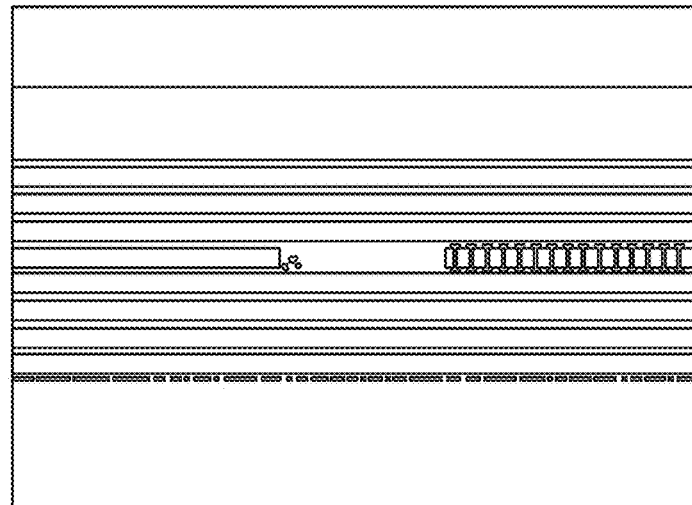
FIG. 4 is a schematic of die cracks due to silicon particles in the bond line, when silicon particles of a size greater than a bond line thickness are interposed between two stacked semiconductor dice.
Figure 5:
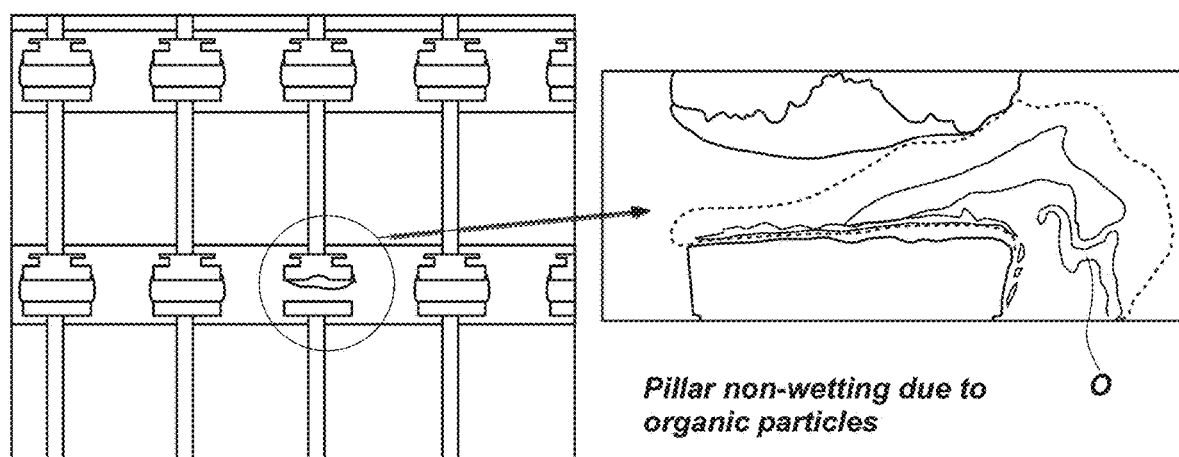
FIG. 5 on the left-hand side is a schematic of a bond line between two adjacent, stacked semiconductor dice and on the right-hand side is an enlarged view of the left-hand circled pillar-to-pad arrangement showing pillar non-wetting and resulting open connection due to the presence of foreign organic material O on the pillar-to-pad interface.

FIG. 1 of the drawings is a photomicrograph showing multiple stacked semiconductor dice with cracks, FIG. 2 is an enlarged photomicrograph showing crack invasion by an underfill material in the bond line, and FIG. 3 is a photograph of a map of a wafer indicating cracked semiconductor dice as dark rectangles. FIG. 4 is a schematic of die cracks due to silicon particles in the bond line, when silicon particles of a size greater than a bond line thickness are interposed between two stacked semiconductor die. FIG. 5 on the left-hand side is a schematic of a bond line between two adjacent, stacked semiconductor die and on the right-hand side is an enlarged view of the left-hand circled pillar-to-pad arrangement showing pillar non-wetting and resulting open connection due to the presence of foreign organic material O on the pillar-to-pad interface.

Both of the foregoing types of particulate contaminants on an exposed NCF surface have been determined to cause significant reduction in die yield, particularly if a blade dicing (i.e., singulation) process is employed, creating sizable and numerous particulate debris. Notably, die yield from NCF contamination becomes progressively worse during processing, commencing with de-bond of the wafer from a carrier wafer, after (i.e., post) grooving of the wafer, after lamination of the wafer to dicing tape supported on a film frame, and post dicing. If a 60 μm contaminant particle size is used as a baseline to determine compromised die (i.e., die kill), yield is progressively reduced from almost 100% post de-bond to little more than 90% post dicing, with about half of the defective die of a wafer compromised of silicon (i.e., solid) particles, and about half compromised of organic (i.e., transparent) particles. However, if a 20 μm contaminant particle size is used as the baseline, yield plummets from over 95% post de-bond to less than 75% post dicing, again with about half of the defective die of a wafer compromised by silicon (i.e., solid) particles, and about half compromised by organic (i.e., transparent) particles. As NCFs of a thickness of about 15 μm are common, and use of NCFs of about 10 μm thickness are contemplated, it can be readily appreciated that even minute contaminant particles, of sizes of about 15 μm or less, may considerably increase die kill. In addition, as the industry progresses toward so-called "zero bond line thickness" of less than about 5 μm using plasma treated silicon oxide or organic materials to bond superimposed, very thin (e.g., about 30 μm) neighboring microelectronic devices, electrically connected by aligned Cu to Cu conductive elements of the neighboring microelectronic devices, even the presence of minute contaminant particles on as surface of a microelectronic device (e.g., active surface of a semiconductor die) may markedly decrease yield of these fragile devices.

The significance of contaminants to yield loss during a pick and place operation may be characterized as facilitating stress concentrations on the surface of a semiconductor die by substantially limiting contact of, for example, the surface of a pick arm to one or more contaminant particles of a size (e.g., diameter) greater than a thickness of the NCF and a height of conductive elements, for example copper pillars protruding from the active surface and within the NCF on the active surface of the die. Thus, instead of spreading the pick arm contact force over an entirety of the NCF and conductive elements and reducing the force per unit area on the die active surface, an entirety of the force may be focused on just a few discrete points on the active surface on which contaminant particles reside and protrude above the NCF.

In addition, non-particulate contamination of the pick arm due to NCF residue remaining on the pick surface may cause issues in force distribution during removal of a semiconductor die from dicing tape, as may build up of dicing tape residue on the back side of a semiconductor die when transferred to a bond tip from a pick arm.

Referring now to FIGS. 6A through 6D of the drawings and with further reference to FIG. 14, an example pick operation of removing a semiconductor die S configured with an active surface A having conductive elements (e.g., metal pillars) for stacking and thermocompression bonding from dicing tape using a pick arm and an ejector of a pick and place apparatus 100 is illustrated in schematic form. Referring to FIG. 6A, a microelectronic device in the form of a semiconductor die S is supported on and adhered to a dicing tape 102 of a pick and place apparatus 100. As is conventional, the dicing tape 102 supports singulated semiconductor dice S for removal from the dicing tape 102. Pick arm 104 of the pick and place apparatus 100 is suspended over and optically aligned with the location of the semiconductor die S. As noted previously, pick arm 104 is movable in the X, Y and Z directions, and is also rotatable about a lateral axis and a longitudinal axis by encoder-equipped drive motors under control of a programmed controller. Once aligned over semiconductor die S, pick arm 104 is rapidly lowered vertically as shown in FIG. 6B until a predetermined, preprogrammed standoff distance, for example 100 μm as depicted, is reached between the pick surface 106 of pick arm 104 and active surface A of semiconductor die S, after which travel of the pick arm 104 is slowed significantly to effect a "soft touch" travel to contact NCF over active surface A. Between the time pick arm 104 is slowed and contact is made with active surface A, ejector 108 moves upward against dicing tape 102 in synchronization with pick arm 104 as shown by vertical arrow E and presents semiconductor die S to pick surface 106, which is equipped with vacuum ports 110 actuated to pull semiconductor die S upward and away from dicing tape 102. Ideally, due to the synchronization, contact force of pick arm 104 is minimized, to no more than about 50 grams to 150 grams contact force at most, and desirably far less. However, due to falling out of calibration of pick arm 104 and/or ejector 108, or incorrect or mismatched encoder values controlling movement as shown in FIG. 6C, pick arm 104 may over travel and, thus, pick surface 106 may over press semiconductor die S, initiating stress microcracks and cracks C from at least one of impact and excessive force applied, damaged semiconductor die S then being removed from dicing tape 102 by pick arm 104 for further handling as shown in FIG. 6D. Similarly, if pick surface 106 is non-parallel to active surface A, or rotationally misaligned with semiconductor die S, edge contact of pick surface 106 with active surface A may occur. A lack of co-planarity of pick surface 106 with respect to active surface A of as little as about 20 μm may result in damage to semiconductor die S. In addition, the presence of contaminants in the form of inorganic or organic particles from the singulation process on active surface A, or NCF residue from prior device picking on pick surface 106 may result in damaging force concentrations on active surface A. Unfortunately, cracks and microcracks C are not easily detectable during handling of a semiconductor die, and their presence may not be apparent until assembled with other semiconductor dice, which assembly and subsequent application of Normal force by a bond head during thermocompression bonding of a die stack may also exacerbate the microcracks into cracked die as shown in FIG. 1.

Figure 7B:
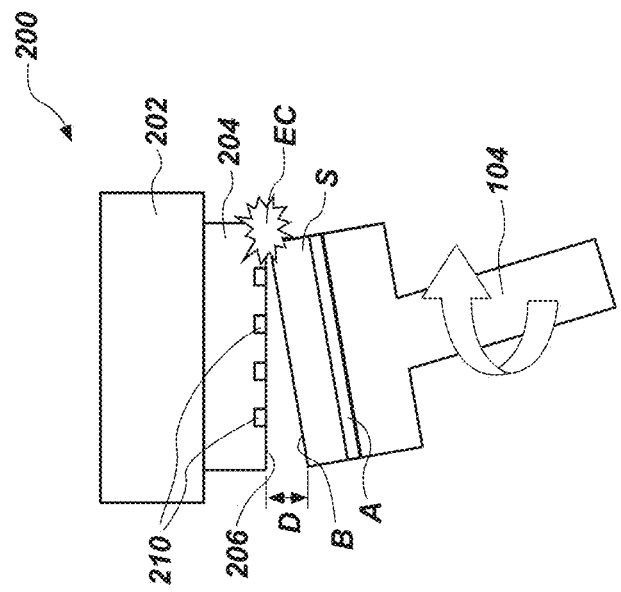
FIGS. 7A and 7B schematically depict example semiconductor die transfer operations from a pick arm to a bond tip of a bond head.
Figure 7A:
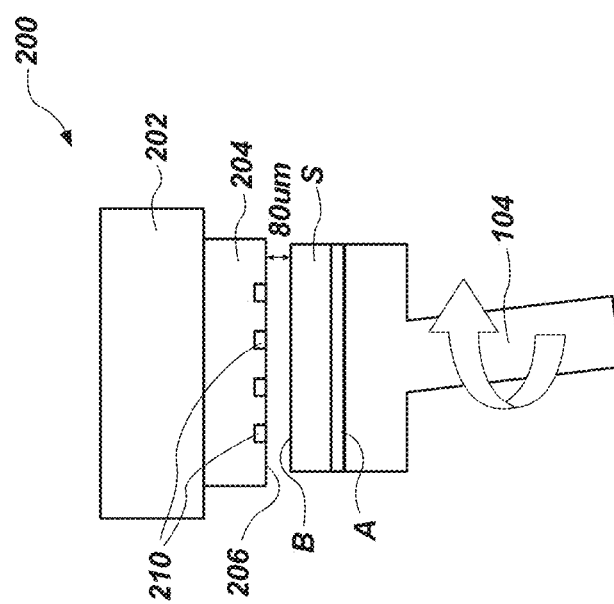

Referring now to FIGS. 7A and 7B of the drawings and with further reference to FIG. 14, an example transfer operation from a pick arm 104 to a bond tip 204 of a bond head 202 of a thermocompression bonding apparatus 200 is illustrated in schematic form. As shown in FIG. 7A, pick arm 104 carrying semiconductor die S by active surface A has been moved in X, Y and Z directions and rotated about a lateral axis and a longitudinal axis as required for presentation of back side surface B to bond tip surface 206 of bond tip 204 of bond head 202 of thermocompression bonding apparatus 200. Pick arm 104 is moved rapidly until a preprogrammed standoff distance, after which pick arm 104 is moved more gently toward, but not in contact with, bond tip 204. When back side surface B is in close proximity to bond tip surface 206, vacuum ports 210 therein are actuated and vacuum ports 110 in pick surface 106 are deactuated, to transfer semiconductor die S to bond tip 204 in a contact-free manner responsive to a pressure differential, while semiconductor die S is isolated from the heat of bond tip 204 as long as possible. As noted previously, the vacuum to vacuum ports 110 in pick surface 106 may be reversed to a small positive pressure and semiconductor die S is "puffed" against bond tip surface 206 for a contactless transfer. As shown in FIG. 7A, in an ideal situation, pick surface 106 has been properly calibrated, when manipulated into proximity to bond head 202, to be parallel to bond tip surface 206 so that the transfer of semiconductor die S is, at worst accomplished with any contact force distributed over the back side surface B of semiconductor die S. However, as depicted in FIG. 7B, during repeated use the movement of pick arm 104 may fall out of calibration, a result of which is that pick surface 106 and, thus back side surface of semiconductor die S is presented (i.e., "tilted") at an acute angle to bond tip surface 206, resulting in edge contact EC of back side surface B with bond tip surface 206, resulting in edge cracking on back side surface B. Edge contact EC may be along a line if pick surface 106 is rotationally oriented to match bond tip surface 206, or it may include point contact of a corner of back side surface B of semiconductor die S if rotationally misaligned in a plane perpendicular to longitudinal axis LO and tilted. It has been found that as minute an angular displacement D of about 75 µm of an edge of the back side surface B from the parallel between back side surface B and bond tip surface 206 may cause microcracking or cracking in semiconductor die S from such edge contact. Similarly, the presence of contaminants in the form of inorganic or organic particles from the singulation process on active surface A, or NCF residue from prior device picking on pick surface 106 may result in damaging force concentrations on active surface A as well as edge contact on back side surface B due to non-parallel orientation of the back side surface B.

Figure 8:
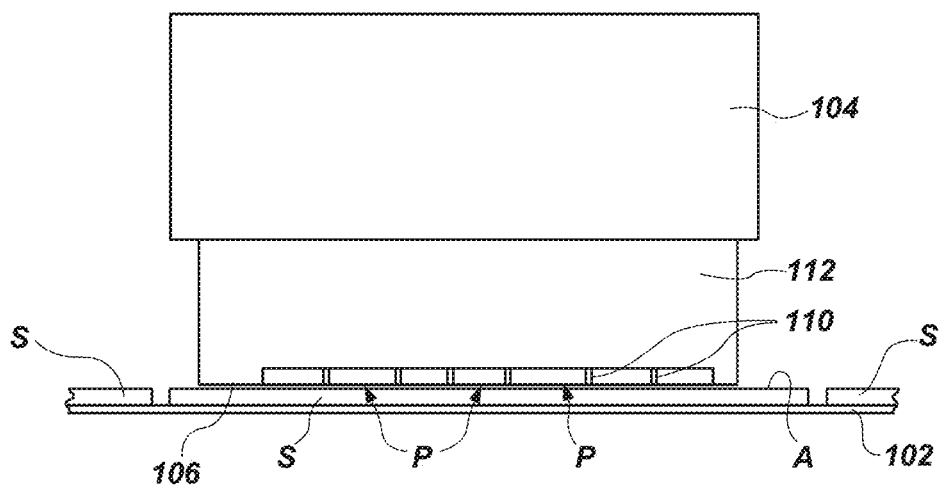
FIG. 8 schematically depicts a conventional pick arm in proximity to a semiconductor die on dicing tape during a pick operation.

Referring now to FIG. 8, an example pick arm 104 in proximity to a semiconductor die S on dicing tape 102 is schematically illustrated. As shown, a pick arm 104 may be equipped with die-specific tooling 112 configured to accommodate a size and shape of semiconductor dice to be picked from a particular wafer, vacuum ports 110 of tooling 112 opening into pick surface 106 being operably coupled to a vacuum line (not shown) extending into and through pick arm 104 to a vacuum source (not shown). As can be seen vacuum ports 110 may, ideally, be placed immediately above active surface A of semiconductor die S to pull active surface A covered by NCF into contact with pick surface 106. Conventionally, there is no proximity sensing conducted to control and stop travel of pick arm 104 toward semiconductor die S, nor is there any mechanism controlling or sensing a non-parallel orientation of pick surface 106 to active surface A of semiconductor die. Thus, while periodic calibration of pick arm movement is employed, die microcracking due to pick arm over travel and over press or angular misalignment may go undetected for picking of dozens of semiconductor dice of a given wafer. As noted previously, the magnitude of microcracking and propensity for further expansion and extension, resulting greater crack damage may not manifest itself until a defective die is stacked and bonded in an assembly. Even if the assembly passes testing, the damage may induce infant mortality of an assembly including, for example, a stack (e.g., eight, twelve, sixteen, thirty-two) of DRAM semiconductor dice. Cracking may also be induced, as noted above, by the presence of particulate contaminants P on the NCF over the active surface A of semiconductor die S, especially when the size (e.g., diameter) of particulate contaminants P is greater than thickness of the NCF. In such an instance, even if pick surface 106 is parallel to active surface A and movement of pick arm 104 is properly calibrated and within tolerances, the present of such particulate contaminants P may result in one or more locations of point contact and force concentration between pick surface 106 and active surface A of semiconductor die S through NCF N, concentrating the force of movement of pick arm 104, even though pick surface 106 is out of physical contact with active surface A, resulting in damage to integrated circuitry of the active surface A. A similar issue may arise if conductive elements (e.g., metal pillars) protruding from active surface A are of uneven height.

Figure 9A:
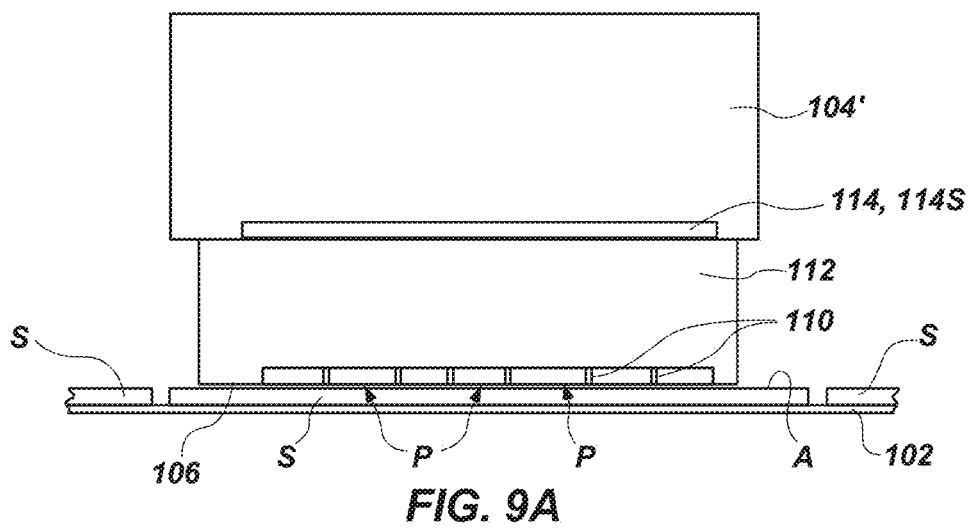
FIG. 9A schematically depicts an embodiment of a pick arm equipped with a force sensor device according to embodiments of the disclosure contacting a semiconductor die on dicing tape.
Figure 9B:
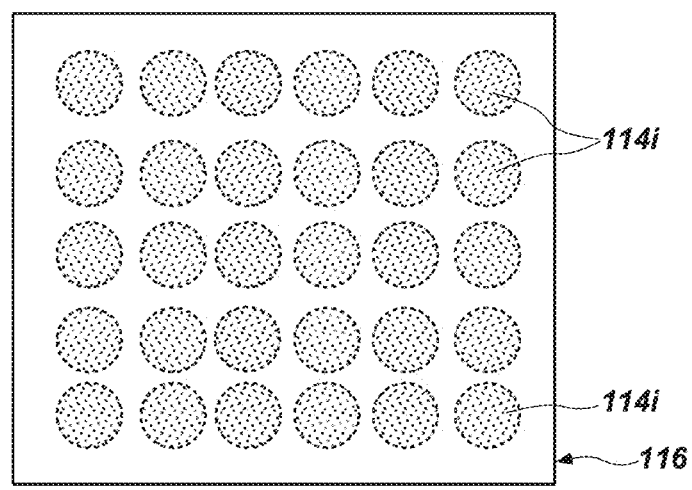
FIG. 9B is a schematic top elevation of a force sensor device configured as an array of individual force sensors.

Referring now to FIG. 9A, an embodiment of a force sensor device 114 equipped pick arm 104' including a single force sensor 114s, which may also be characterized as a sensor element, contacting a semiconductor die S on dicing tape 102 is schematically illustrated. FIG. 9B is a schematically illustrated force sensor device 114 configured as an array 116 of individual force sensors 114i, which may also be characterized as an array of sensor elements, carried by the pick arm 104'. In FIG. 9A, elements common with FIG. 8 bear the same reference numerals. However, in addition to the elements of pick arm 104 of FIG. 8, pick arm 104' includes a force sensor device 114 carried by pick arm 104' and, by way of example only, interposed between pick arm 104' and tooling 112. As noted, force sensor device 114 may comprise, for example, a single force sensor 114s as depicted in FIG. 9A, or an array 116 of individual force sensors 114i, as depicted in FIG. 9B.

If a single force sensor 114s is employed, force sensor 114s (FIG. 9A) may be configured, for example, as a spring-loaded sensor approximating force from a spring constant and displacement, or a load cell. An example of the latter is an FS19 compression load cell, offered by Strain-Sense Limited, Milton Keynes, United Kingdom. Such a load cell approach allows detection of over press by pick arm 104', whether due to uniform but overly robust contact of pick surface 106 with NCF over active surface of semiconductor die S, or point contact of pick surface 106 with particulate contaminants P of a size greater than an NCF (not shown) thickness. Accordingly, an over press signal generated from a force sensor 114s may be used to signal the controller 122 of the pick and place apparatus to divert a picked die for inspection, remediation and requalification (if possible) or discard rather than transfer to bond tip 204 for stacking and thermocompression bonding. However, if pick surface 106 with a single force sensor 114s is not parallel to active surface A of semiconductor die S, misleading reading may result. Similarly, depending on the force sensor type employed, the presence of particulate contaminants P may result in a false force reading or a reading failure. However, to overcome such a problem and detect over travel and over press as well as impact from angular misalignment of a pick arm, a non-directional piezoelectric shock sensor of a design as disclosed in U.S. Pat. No. 5,811,910 may be employed as a force sensor 114s. Another suitable force sensor configuration is a capacitive MEMS force sensor formed on a silicon membrane disclosed in U.S. Pat. No. 8,984,966. A further force sensor configuration providing three-axis force sensing in a single force sensor is a three-axis MEMS piezoelectric load sensor disclosed in U.S. Pat. No. 9,261,423. Yet another mechanism described in the context of sensing positions of a piezoelectric actuator in U.S. Pat. No. 9,791,491 may be adapted to sense position, and thus linear and angular displacement and corresponding loading, of a pick arm pick surface. Other suitable force sensors may be available from TE Connectivity of Berwyn, PA and Futek Advanced Sensor Technology of Irvine, CA.

An array 116 or other arrangement of individual force sensors 114i provides the capability for a more sophisticated identification and qualification of artifact events indicative of potential damage to a semiconductor die S. The individual force sensors 114i may be fabricated as separate elements and combined, or in a single structure as individual segments of a larger material, as disclosed in U.S. Pat. No. 9,362,481, which describes the use of a piezoelectric polymer film, which film may be selectively metallized in discrete regions to produce a sensor array, where each discrete region functions as a separate sensor. In addition, the above-referenced U.S. Pat. No. 9,261,423 discloses to use of a combination of, for example, four of the three-axis MEMS piezoelectric load sensors in a rectangular configuration and operating in parallel. Further, the load sensors may be fabricated in an array, or in a spaced-apart "constellation" configuration. Such arrangements may detect loads (i.e., forces and moments) in six axes. Yet further, U.S. Pat. No. 9,902,611 discloses a MEMS force sensor employing multiple piezoresistive sensor elements.

Figure 10A:
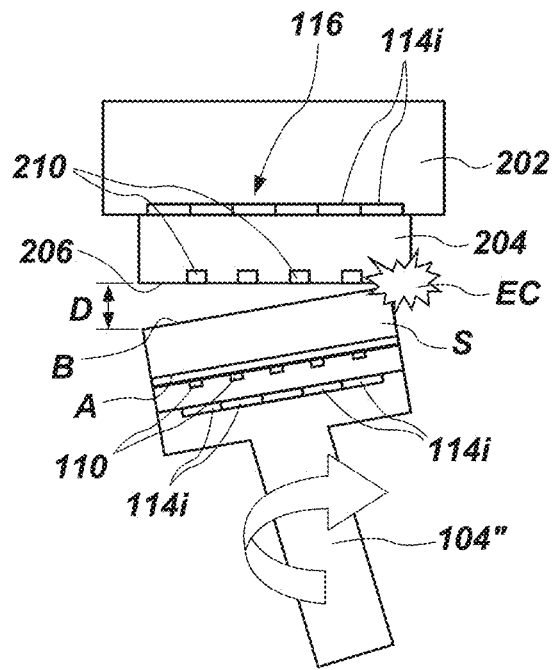
FIG. 10A schematically illustrates another embodiment of microelectronic device carried by a multiple force sensor equipped pick arm contacting a bond tip of a bond head in a non-parallel manner and FIG. 10B is a schematic top elevation of a force sensor device configured as an array of individual force sensors.
Figure 10B:
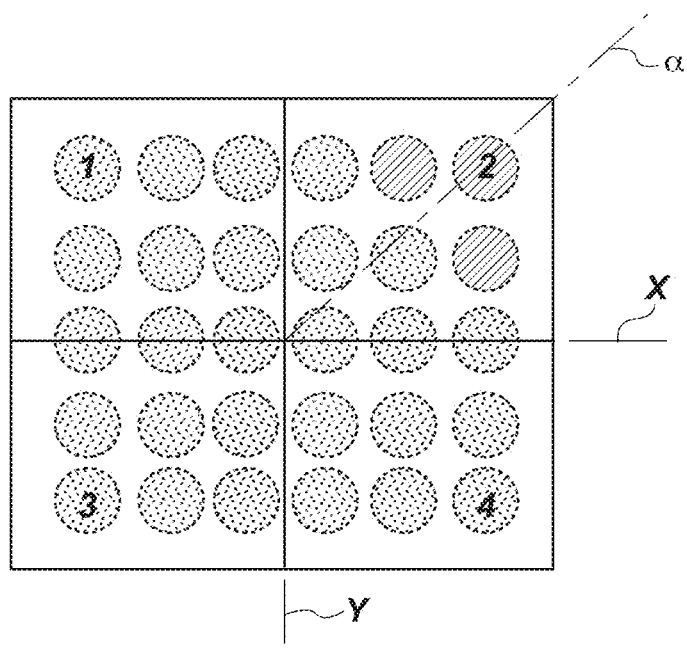

Referring now to FIGS. 10A and 10B, another embodiment of a semiconductor die S carried by a multiple force sensor equipped pick arm 104" contacting a bond tip 204 of a bond head 202 in a non-planar manner is schematically illustrated, and FIG. 10B is a schematically illustrated response of the array 116 of force sensors 114i of the pick arm 104" to the non-planar contact.

As depicted previously in FIG. 7B, during repeated use the movement of pick arm 104 may fall out of calibration, a result of which is that pick surface 106 and, thus back side surface B of semiconductor die S is presented at an acute angle and this distance D to bond tip surface 206, the acute angle also being at an angle between the X and Y axes of the array 116 resulting in edge contact EC of back side surface B with bond tip surface 206, resulting in edge cracking on back side surface B, which may migrate into the body of semiconductor die S. While such damage might go undetected when using conventional pick arm 104, the four quadrant array 116 of individual force sensors 114i of pick arm 104" allows detection in quadrant 2 of the array (shown as striped hatching) of not only the occurrence of edge contact EC, but also the angular location a of the edge contact EC with respect to the X and Y planes of the array 116 when the mutual tilt of bond tip surface 206 and back side surface B is not exactly in either an X or a Y orientation. Again, a detection of incorrect and potentially damaging contact of bond tip surface 206 with back side surface B of semiconductor die S may initiate a signal to the controller 122 of the pick and place apparatus 100 to cease movement of the pick arm 104" and divert semiconductor die S for inspection, requalification, remediation if possible, or discard. Sensor structures and configurations disclosed in the above-referenced U.S. Pat. No. 9,362,481, U.S. Pat. Nos. 9,261,423 and 9,902,611 may be used to implement the force magnitude and location detection function described with respect to force sensor equipped pick arm 104".

Figure 11A:
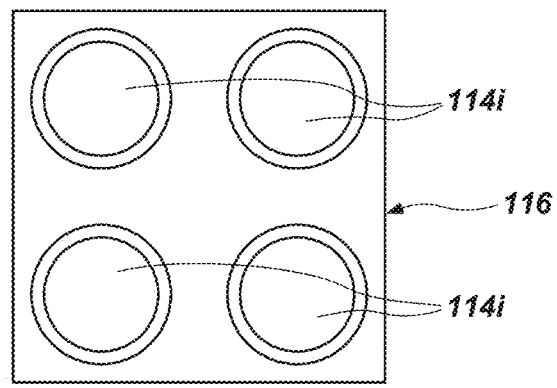
FIGS. 11A through 11C schematically illustrate top elevations of other arrangements of individual force sensors suitable for disposition in pick arms, according to embodiments of the disclosure.
Figure 11B:
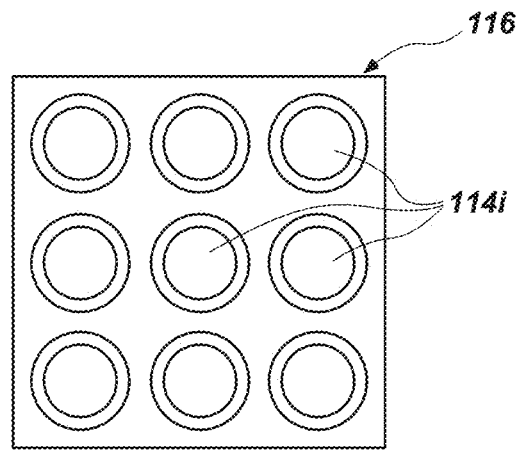
Figure 11C:
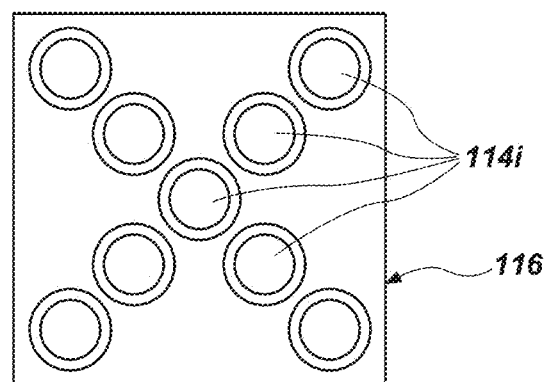

Referring now to FIGS. 11A-11C, further schematic arrangements of force sensors including multiple individual force sensors 114i for a pick arm are illustrated. As depicted in FIG. 11A, one contemplated force sensor arrangement locates four individual force sensors 114i at corners of a sensor device, providing a capability of detecting and signaling an over press condition, and out of planarity (i.e., non-planar) orientation of a pick surface, or the presence of contaminants over a large portion of a microelectronic device surface. As depicted in FIG. 11B, another contemplated arrangement locates a central, individual force sensor 114i and a frame of surrounding, individual force sensors 114i. FIG. 11C depicts another, "X" shaped arrangement of individual force sensors 114i.

In any of the foregoing embodiments, one or more signals representative of one or more forces, one or more locations of force, or both, applied by a pick arm 104' or 104" directly or through a microelectronic device carried on the pick surface 106 may be generated by a force sensor device 114 carried by the pick arm, transmitted to controller 122 of the pick and place apparatus (see broken line SS in FIG. 14), and processed by a microprocessor 124 of the controller 122 to determine if damage to a microelectronic device likely occurred. If so, potentially further damaging movement of pick arm 104' or 104" is ceased by controller 122, and the microelectronic device diverted from its intended first destination (e.g., bond tip of a thermocompression bonding apparatus) before or after attempted transfer to bond tip 204 to a second destination for inspection, requalification, remediation if possible, or discard.

Figure 12:
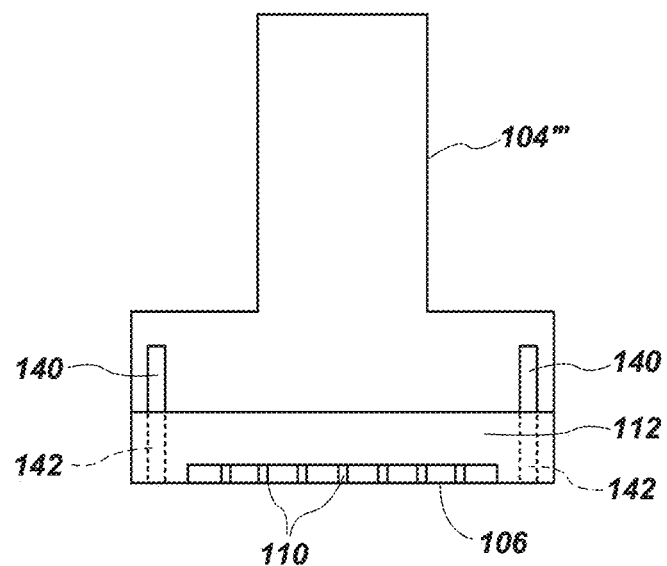
FIG. 12 is a schematic side elevation of a pick arm equipped with an acoustic crack sensor aligned with a singulated microelectronic device to be removed from dicing tape by the pick arm.

Referring now to FIG. 12, an embodiment of pick arm 104''' equipped with one or acoustic sensors 140 is schematically illustrated. As shown, die specific tooling 112 may optionally incorporate an acoustic transmission media (e.g., acoustic gel) or a wave guide 142 aligned with each of the acoustic sensors 140 to facilitate transmission of sound indicative of cracking of a semiconductor die and to isolate the acoustic sensors 140 from artifact associated with the vacuum of the pick operation. U.S. Pat. No. 3,924,456 US and U.S. Patent Publication 2014/0208850A1 disclose acoustic sensors which may be incorporated in pick arm 104''' to detect initiation of cracking during picking and transfer of a microelectronic device to another apparatus.

Figure 13:
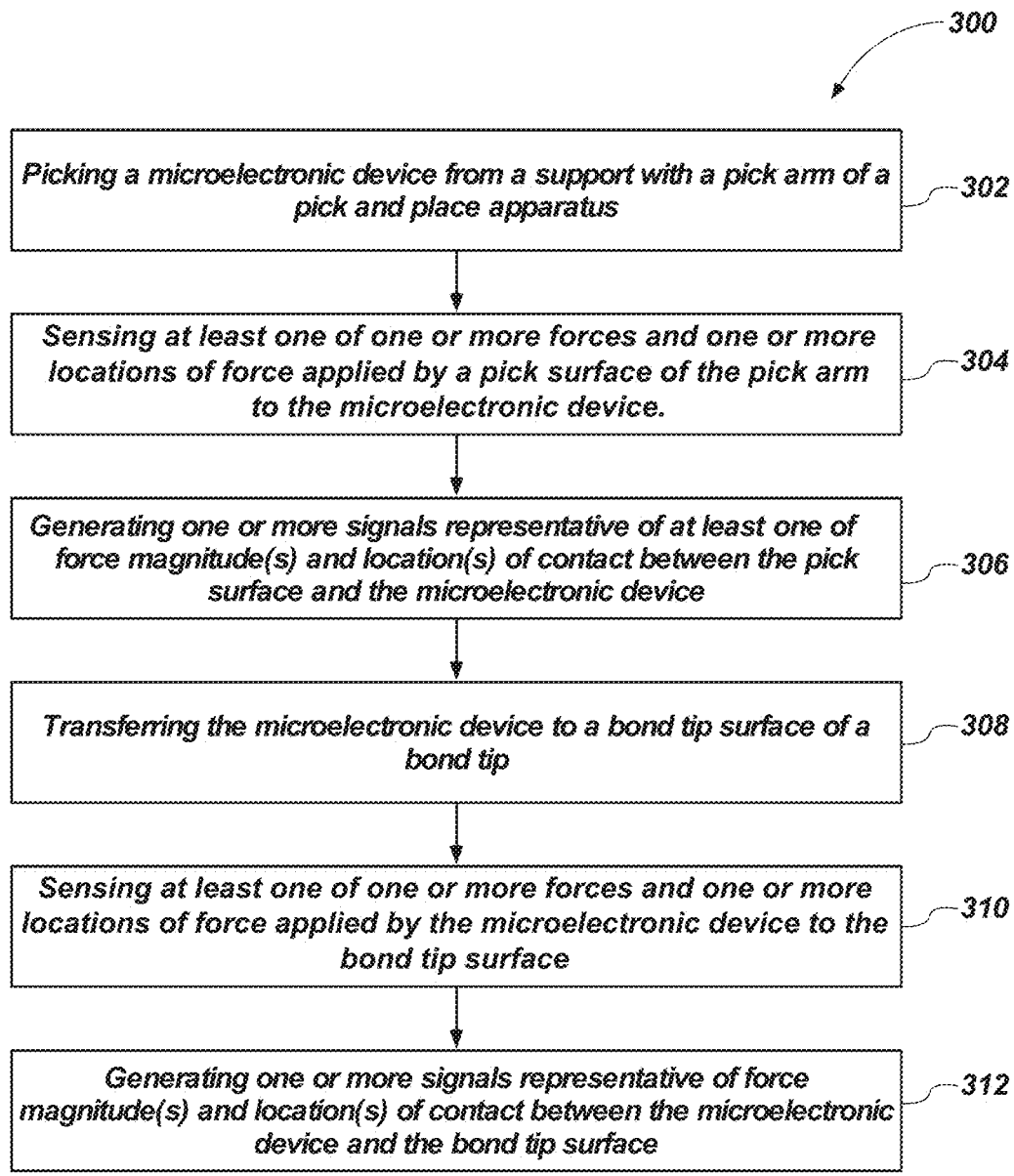
FIG. 13 is a flow diagram of a method according to embodiments of the disclosure.

As depicted in the flow diagram of FIG. 13, in their broadest sense, embodiments of the disclosure may be implemented by a method 300 comprising an act 302 of picking a microelectronic device from a support with a pick arm of a pick and place apparatus, an act 304 of sensing at least one of one or more forces and one or more locations of force applied by a pick surface of the pick arm to the microelectronic device, an act 306 of generating one or more signals representative of at least one of force magnitude(s) and location(s) of contact between the pick surface and the microelectronic device, an act 308 of transferring the microelectronic device to a bond tip surface of a bond tip, an act 310 of sensing at least one of one or more forces and one or more locations of force applied by the microelectronic device to the bond tip surface, and an act 312 of generating one or more signals representative of force magnitude(s) and location(s) of contact between the microelectronic device and the bond tip surface.

To elaborate further with respect to the operation of embodiments of the disclosure, the use of sensor devices including one or more sensors carried by a pick arm of a pick and place apparatus offers a number of opportunities to determine the likelihood of damage to each microelectronic device as it is being handled, for example from picking of the device from dicing tape on a film frame to transferring the microelectronic device to a bond tip surface of a thermocompression bonding apparatus for disposition by the bond tip on a target substrate or on another device in a stack of devices.

Specifically, the presence of sensor devices configured according to embodiments of the disclosure and in communication with a controller of the pick and place apparatus, allows the controller to cause movement of the pick arm and pick surface toward a surface of a structure, or of a microelectronic device carried by the pick arm to another to cease upon the sensor device generating one or more signals representative of magnitudes and locations of force applied to the microelectronic device associated with pick arm movement and, optionally, to cause the pick arm to move the microelectronic device to a second destination instead of a first, intended destination for inspection, requalification, remediation, or discard if force-induced microcracking or cracking of the device renders it beyond repair. Such a capability significantly reduces the potential number of microelectronic devices picked from a wafer which might be damaged due to the picking or transfer operations due to pick arm over travel and over press, non-parallel orientation of the pick surface of the pick arm or of a surface of a microelectronic device carried by the pick arm with a facing surface of another structure, or rotational misalignment of the pick surface with a microelectronic device being picked or of the microelectronic device carried by the pick arm with a bond tip surface. Further, contaminants on the surface (i.e., NCF) of the microelectronic device, on the pick surface, or on the bond tip surface may result in point contact and force concentration. Similarly, contamination in the form of NCF residue sticking to the pick surface or the bond tip surface may result in misalignment (i.e., nonparallel orientation) between facing surfaces, causing damaging edge contact of the microelectronic device.

By way of non-limiting example only, one or more conditions during operation of the pick arm may be sensed by the sensor device sensing one or more forces, locations, or both of contact between surfaces associated with movement of the pick arm, one or more signals generated by the sensor device responsive to the sensed conditions. The pick and place apparatus controller, responsive to the signals, determines a potential for device damage so that operation of the pick arm may cease, a cause or causes of the problem determined, and pick and place operations with other microelectronic devices resumed after the problem or problems are addressed and the potentially damaged microelectronic device inspected, requalified, remediated, or discarded. Such conditions include, during a pick operation, a contact force between the pick surface and the microelectronic device exceeding a threshold magnitude, a single point of contact between the pick surface and the microelectronic device, multiple points of contact between the pick surface and the microelectronic device at or below a certain number, multiple points of contact between the pick surface and the microelectronic device along a line, contact of less than about 90% of a surface area of the pick surface with the microelectronic device, non-parallel orientation of the pick surface relative to a facing surface of the microelectronic device above a threshold acute angle, or rotational misalignment of the pick arm relative to a microelectronic device. Such conditions also include, during a transfer of a microelectronic device from a pick arm to a bond tip, a contact force between the bond tip surface and the microelectronic device surface exceeding a threshold magnitude, a single point of contact between the bond tip surface and the microelectronic device surface, multiple points of contact between the bond tip surface and the microelectronic device surface at or below a certain number, multiple points of contact between the bond tip surface and the microelectronic device surface along a line, contact of less than about 90% of a surface area of the microelectronic device surface with the bond tip surface, non-parallel orientation of the microelectronic device surface relative to the bond tip surface above a threshold acute angle, or rotational misalignment of the pick arm and, thus the carried microelectronic device and the bond tip surface.

By way of further elaboration with respect to the scope of embodiments of the disclosure, while the incorporation of force sensor devices and force sensors has been discussed and illustrated in the context of application to pick arms, the disclosure is not so limited. For example, similar force sensor devices in the form of arrays 116 or other arrangements of individual force sensors 114*i* may be carried by bond tips of bond heads (see FIG. 10A) to detect impacts, magnitudes of forces, and locations of forces experienced as a result of contact between, for example, contact between a microelectronic device (e.g., semiconductor die) and the bond tip surface during transfer from a pick arm, a microelectronic device carried by a bond tip surface during placement (e.g., stacking) on another microelectronic device or substrate, or during application of force by a bond head to effect mutual bonding of microelectronic devices of a stack. Such an application may be especially suitable for, but not limited to, hybrid bonding of stacks of semiconductor dice. Such bonding techniques may be employed to obtain near-zero bond line thicknesses, and utilize either inorganic (e.g., silicon oxide) or organic dielectric material in bond lines between adjacent dice in combination with discrete conductive (e.g., copper) elements in the bond lines for conductive paths between components. The hybrid bonding operation may be conducted with low bond head forces and at ambient or near-ambient temperatures, and incorporation of force sensor arrangements may be useful in detecting excessive force, uneven application of force, or both, during a hybrid bonding operation to identify potentially defective multi-die devices for further inspection, remediation or discard.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate including a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. The term "substrate" also means and includes organic substrates, for example, substrates having multiple metal layers in the form of traces and is interposed with dielectric layers (e.g., resin-glass weave polymers). For example, conventional BGA packages include multiple die and encapsulation (e.g., epoxy molding compound (EMC)) on one side of an organize substrate and an array of solder balls on the other side.

As used herein, the term "microelectronic device" means and includes by way of non-limiting example, semiconductor die, die exhibiting functionality through other than semiconductive activity, microelectrical mechanical systems (MEMs) devices, substrates comprising multiple die including conventional wafers as well as other bulk substrates as mentioned above, and partial wafers and substrate segments including more than one die location.

As used herein, the term "memory device" means and includes, by way of non-limiting example, semiconductor and other microelectronic devices exhibiting memory functionality, but not excluding other functionality unless otherwise clearly indicated by the context of use of the term. Stated another way, and by way of example only, the term "memory device" means and includes not only conventional memory in the form of DRAM, NAND, etc., but also by way of example only, an application specific integrated circuit (ASIC) (e.g., a system on a chip (SoC)), a microelectronic device combining logic and memory, or a graphics processing unit (GPU) incorporating memory.

As used herein, the terms "metal" and "metal material" mean and include, unless otherwise expressly stated, elemental metals, metal alloys and combinations (e.g., layers) of different and adjacent metals or metal alloys.

CONCLUSION

Embodiments of the disclosure include apparatus for handling microelectronic devices, comprising a pick arm having a pick surface configured for receiving a microelectronic device thereon, drives for moving the pick arm and reorienting the pick surface in the X, Y and Z planes and about a horizontal rotational axis and a vertical rotational axis, and a sensor device carried by the pick arm and configured to detect at least one of at least one magnitude of force or at least one location of force applied between the pick surface and a structure contacted by the pick surface or a structure and a microelectronic device carried on the pick surface.

Embodiments of the disclosure include a method, comprising moving a pick arm of a pick and place apparatus toward a singulated microelectronic device initiating contact of the microelectronic device with a pick surface of the pick arm and sensing, with a sensor device carried by the pick arm, at least one of one or more forces or one or more locations of force applied between the pick surface and the contacted microelectronic device.

Embodiments of the disclosure include apparatus for handling microelectronic devices, comprising a bond head comprising a bond tip having a bond tip surface for receiving a microelectronic device thereon and a sensor device comprising multiple sensors carried by the bond head and configured to detect at least one of at least one magnitude of force or at least one location of force applied between the bond tip surface and a microelectronic device contacting the bond tip surface, a microelectronic device carried by the bond tip surface and another microelectronic device, or the bond tip surface and a stack of microelectronic devices.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of one or more other disclosed embodiments while still being encompassed within the scope of the disclosure.

The invention claimed is:

1. Apparatus for handling microelectronic devices, comprising:
   a pick arm having a pick surface configured for receiving a microelectronic device thereon;
   drives for moving the pick arm and reorienting the pick surface in X, Y and Z planes and about a horizontal rotational axis and a vertical rotational axis;
   a sensor device carried by the pick arm and configured to detect at least one of at least one magnitude of force or at least one location of force applied between the pick surface and a structure contacted by the pick surface or a structure and a microelectronic device carried on the pick surface; and
   a controller programmed to control the drives for moving the pick arm and reorienting of the pick surface, the controller configured to reorient the microelectronic device carried on the pick surface responsive to the sensor device detecting the at least one of at least one magnitude of force or at least one location of force applied between the structure and the microelectronic device.

2. The apparatus of claim 1, wherein the sensor device comprises a single sensor element.

3. The apparatus of claim 2, wherein the single sensor element comprises a load cell, a non-directional piezoelectric shock sensor, a capacitive MEMS force sensor, a three-axis MEMS piezoelectric force sensor or a piezoelectric actuator adapted to sense position.

4. The apparatus of claim 1, wherein the sensor device comprises multiple sensor elements.

5. The apparatus of claim 4, wherein the multiple sensor elements are fabricated as separate elements and combined, or fabricated in a single structure as individual segments of a larger material.

6. The apparatus of claim 5, wherein the multiple sensor elements comprise a selectively metallized piezoelectric polymer film, multiple three-axis MEMS piezoelectric load sensors, or multiple piezoresistive sensor elements.

7. The apparatus of claim 4, wherein the multiple sensor elements are configured in an array of rows and columns of sensor elements.

8. The apparatus of claim 1, wherein the sensor device is configured to generate a signal representative of the at least one magnitude of force and the apparatus is configured to communicate the signal to the controller.

9. The apparatus of claim 8, wherein the controller is programmed to cause intended movement of the pick arm toward a structure to cease responsive to the signal representing a force magnitude at or above a threshold.

10. The apparatus of claim 9, wherein the threshold force magnitude is preselected and programmed to the controller.

11. The apparatus of claim 9, wherein the controller is programmed,
   responsive to the representative signal to cause the pick arm to divert the microelectronic device from a first, intended destination to a second destination.

12. The apparatus of claim 1, wherein the sensor device is configured to generate a signal representative of the at least one location of force applied and the apparatus is configured to communicate the signal to the controller.

13. The apparatus of claim 12, wherein the controller is programmed to cause intended movement of the pick arm toward a structure to cease responsive to the signal representing force applied at a single point of contact, at multiple points of contact at or below a predetermined number, multiple points of contact arranged in a line, contact across less than about 90% of surface area of the pick surface, non-parallel orientation of the pick surface relative to a facing surface of a structure, or rotational misalignment of the pick surface with a facing surface of a structure.

14. The apparatus of claim 13, wherein the controller is programmed,
   responsive to the representative signal to cause the pick arm to divert the microelectronic device from a first, intended destination to a second destination.

15. The apparatus of claim 1, wherein the sensor device is configured to generate signals representative of the at least one magnitude of force applied and the at least one location of force applied and the apparatus is configured to communicate the signals to the controller.

16. The apparatus of claim 15, wherein the controller is programmed to cause intended movement of the pick arm toward a structure to cease responsive to one or more of a signal representing a magnitude of applied force at or above a threshold magnitude or a signal representing force applied at a single point of contact, at multiple points of contact at or below a predetermined number, multiple points of contact arranged in a line, contact across less than about 90% of surface area of the pick surface, non-parallel orientation of the pick surface relative to a facing surface of a structure above a threshold acute angle, or rotational misalignment of the pick surface and a facing surface of a structure.

17. The apparatus of claim 15, wherein the controller is programmed, responsive to the signals, to determine a position of a non-parallel orientation of the pick surface to a surface of a structure contacted by the pick surface or a microelectronic device carried by the pick surface from at least some of the representative signals.

18. The apparatus of claim 17, wherein the controller is programmed to cause intended movement of the pick arm toward the structure to cease upon a determination of a non-parallel orientation above a threshold acute angle.

19. The apparatus of claim 1, wherein the pick arm includes tooling bearing the pick surface specific to a size and shape of microelectronic devices to be handled by the pick arm.

20. The apparatus of claim 19, wherein the sensor device is located between the tooling and a portion of the pick arm operably coupled to the drives.

21. The apparatus of claim 20, further including vacuum ports opening onto the pick surface and selectively operably coupled to a vacuum source.

22. The apparatus of claim 1, further comprising vacuum ports opening onto the pick surface and selectively operably coupled to a vacuum source.

23. The apparatus of claim 1, further comprising one or more acoustic sensors carried by the pick arm, the one or more acoustic sensors configured and positioned to detect acoustic emissions associated with contact between at least one of a microelectronic device and the pick surface or a microelectronic device carried on the pick surface and a bond tip surface.

24. A method, comprising:
   moving a pick arm of a pick and place apparatus toward a singulated microelectronic device;

initiating contact of the microelectronic device with a pick surface of the pick arm; and sensing, with a sensor device carried by the pick arm, at least one of one or more forces or one or more locations of force applied between the pick surface and the contacted microelectronic device;

generating, with the sensor device, one or more signals representative of the at least one of one or more forces or one or more locations of force applied between the pick surface and the contacted microelectronic device;

transmitting the one or more signals to a controller configured to control movement of the pick arm;

the controller determining, from the one or more signals, if at least one of the conditions is present:
 a contact force between the pick surface and the microelectronic device exceeds a threshold magnitude;
 a single point of contact between the pick surface and the microelectronic device;
 multiple points of contact between the pick surface and the microelectronic device at or below a certain number;
 multiple points of contact between the pick surface and the microelectronic device along contact of less than about 90% of a surface area of the pick surface with the microelectronic device;
 non-parallel orientation of the pick surface relative to a facing surface of the microelectronic device above a threshold acute angle; or
 rotational misalignment of the pick surface and the microelectronic device;

receiving the microelectronic device on the pick surface;

reorienting the pick surface to cause the microelectronic device to face a bond tip surface of a thermocompression bonding apparatus bond head;

moving the pick arm into a position with a surface of the microelectronic device in proximity and facing to the bond tip surface;

transferring the microelectronic device from the pick surface to the bond tip surface; and sensing, with the sensor device, at least one of one or more forces or one or more locations of force applied between the surface of the microelectronic device and the bond tip surface.

25. The method of claim 24, further comprising, responsive to the determined presence of the at least one of the conditions, the controller ceasing movement of the pick arm toward the microelectronic device.

26. The method of claim 24, further comprising the sensor device generating one or more signals representative of the at least one of one or more forces or one or more locations of force applied between the surface of the microelectronic device and the bond tip surface;

transmitting the one or more signals to a controller configured to control movement of the pick arm;

the controller determining, from the one or more signals, if at least one of the following conditions is present:
 a contact force between the bond tip surface and the microelectronic device surface exceeds a threshold magnitude;
 a single point of contact between the bond tip surface and the microelectronic device surface;
 multiple points of contact between the bond tip surface and the microelectronic device surface at or below a certain number;
 multiple points of contact between the bond tip surface and the microelectronic device surface along a line;
 contact of less than about 90% of a surface area of the microelectronic device surface with the bond tip surface;
 non-parallel orientation of the microelectronic device surface relative to the bond tip surface above a threshold acute angle; or
 rotational misalignment of the microelectronic device relative to the bond tip surface.

27. The method of claim 26, further comprising, responsive to the determined presence of the at least one of the conditions of claim 26, the controller ceasing movement of the pick arm toward the microelectronic device.

28. The method of claim 24, further comprising sensing acoustic emissions associated with contact of the pick surface of the pick arm with the microelectronic device, or contact of the microelectronic device carried by the pick surface with a bond tip surface of a bond tip of a bond head.

29. Apparatus for handling microelectronic devices, comprising:
 a bond head comprising a bond tip having a bond tip surface for receiving a microelectronic device thereon;
 a sensor device comprising multiple sensors carried by the bond head and configured to detect at least one of at least one magnitude of force or at least one location of force applied between the bond head and a microelectronic device contacting the bond tip surface, a microelectronic device carried by the bond tip surface and another microelectronic device, or the bond tip and a stack of microelectronic devices; and
 a controller configured to direct movement of the bond head, the controller programmed to cause intended movement of the bond head toward a structure to cease responsive to a signal generated by the sensor device and to cause the bond head to divert the microelectronic device from a first, intended destination to a second destination.

30. The apparatus of claim 29, wherein the controller is configured to reorient the microelectronic device carried on the bond tip surface responsive to the sensor device detecting the at least one of at least one magnitude of force or at least one location of force applied between a structure and the microelectronic device.

31. The apparatus of claim 29, wherein the multiple sensors of the sensor device comprise four individual force sensors at respective corners of the sensor device.

* * * * *

UNITED STATES PATENT AND TRADEMARK OFFICE
CERTIFICATE OF CORRECTION

PATENT NO. : 11,911,904 B2
APPLICATION NO. : 16/930144
DATED : February 27, 2024
INVENTOR(S) : Kuan Wei Tseng and Brandon P. Wirz et al.

It is certified that error appears in the above-identified patent and that said Letters Patent is hereby corrected as shown below:

In the Specification
Column 6, Line 2, change "about 50 and are" to --about 50 µm, and are--
Column 11, Line 31, change "location a of the" to --location α of the--

In the Claims
Claim 26, Column 19, Line 56, change "the following conditions" to --the conditions--

Signed and Sealed this
Twentieth Day of August, 2024

Katherine Kelly Vidal
*Director of the United States Patent and Trademark Office*